(12) United States Patent
Condon et al.

(10) Patent No.: US 7,397,263 B2
(45) Date of Patent: Jul. 8, 2008

(54) SENSOR DIFFERENTIATED FAULT ISOLATION

(75) Inventors: Kevin L. Condon, Essex Junction, VT (US); Theodore M. Levin, Burlington, VT (US); Leah M. Pastel, Essex, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/670,001

(22) Filed: Feb. 1, 2007

(65) Prior Publication Data

US 2007/0126450 A1    Jun. 7, 2007

Related U.S. Application Data

(62) Division of application No. 10/907,787, filed on Apr. 15, 2005, now Pat. No. 7,202,689.

(51) Int. Cl.
    *G01R 31/02* (2006.01)
(52) U.S. Cl. .................. 324/765; 324/752; 324/501; 714/733
(58) Field of Classification Search .......... 324/750, 324/752, 763, 501, 765; 257/40, 48; 714/733, 714/735
    See application file for complete search history.

(56) References Cited

U.S. PATENT DOCUMENTS

| | | | |
|---|---|---|---|
| 4,706,018 A | 11/1987 | Beha et al. | |
| 4,761,607 A | 8/1988 | Shiragasawa et al. | |
| 5,272,434 A | 12/1993 | Meyrueix et al. | |
| 5,422,498 A * | 6/1995 | Nikawa et al. | ............... 257/48 |
| 5,430,305 A | 7/1995 | Cole, Jr. et al. | |
| 5,705,821 A | 1/1998 | Barton et al. | |
| 5,750,981 A | 5/1998 | Fonash | |
| 5,804,980 A | 9/1998 | Nikawa | |
| 5,905,381 A * | 5/1999 | Wu | ............................ 324/752 |
| 5,963,038 A | 10/1999 | De Jong et al. | |
| 6,028,435 A | 2/2000 | Nikawa | |
| 6,066,956 A | 5/2000 | Nikawa | |
| 6,078,183 A | 6/2000 | Cole, Jr. | |
| 6,154,039 A | 11/2000 | Wu | |
| 6,160,407 A | 12/2000 | Nikawa | |
| 6,169,408 B1 * | 1/2001 | Kantor et al. | ............... 324/752 |
| 6,407,560 B1 | 6/2002 | Walraven et al. | |
| 6,411,100 B1 | 6/2002 | Takasu | |
| 6,430,728 B1 | 8/2002 | Goruganthu et al. | |
| 6,444,895 B1 | 9/2002 | Nikawa | |

(Continued)

*Primary Examiner*—Jermele M. Hollington
*Assistant Examiner*—Arleen M Vazquez
(74) *Attorney, Agent, or Firm*—Gibb & Rahman, LLC; Michael LeStrange, Esq.

(57) ABSTRACT

Disclosed is an apparatus and method for diagnostically testing circuitry within a device. The apparatus and method incorporate the use of energy (e.g., light, heat, magnetic, electric, etc.) applied directly to any location on the device that can affect the electrical activity within the circuitry being tested in order to produce an indicator of a response. A local sensor (e.g., photonic, magnetic, etc.) is positioned at another location on the device where the sensor can detect the indicator of the response within the circuitry. A correlator is configured with response location correlation software and/or circuit tracing software so that when the indicator is detected, the correlator can determine the exact location of a response causing a device failure and/or trace the connectivity of the circuitry, based upon the location of the energy source and the location of the sensor.

20 Claims, 9 Drawing Sheets

U.S. PATENT DOCUMENTS

| | | |
|---|---|---|
| 6,529,018 B1 | 3/2003 | Stevens |
| 6,541,987 B1 | 4/2003 | Bruce |
| 6,549,022 B1 | 4/2003 | Cole, Jr. et al. |
| 6,587,258 B1 | 7/2003 | Kane |
| 6,608,494 B1 | 8/2003 | Bruce et al. |
| 6,635,839 B1 | 10/2003 | Gilfeather et al. |
| 6,650,768 B1 | 11/2003 | Evans et al. |
| 6,657,446 B1 | 12/2003 | Goruganthu et al. |
| 6,677,760 B1 | 1/2004 | Koyama |
| 6,686,757 B1 * | 2/2004 | Ring et al. .................. 324/765 |
| 6,724,928 B1 | 4/2004 | Davis |
| 6,842,021 B1 * | 1/2005 | Weaver et al. ............... 324/752 |
| 6,859,031 B2 * | 2/2005 | Pakdaman et al. .......... 324/233 |
| 2003/0146761 A1 | 8/2003 | Pakdaman et al. |
| 2003/0168594 A1 | 9/2003 | Muckenhirn |
| 2003/0206027 A1 | 11/2003 | Nozoe et al. |
| 2003/0210057 A1 | 11/2003 | Cotton et al. |
| 2004/0073875 A1 | 4/2004 | Kitchin |

* cited by examiner

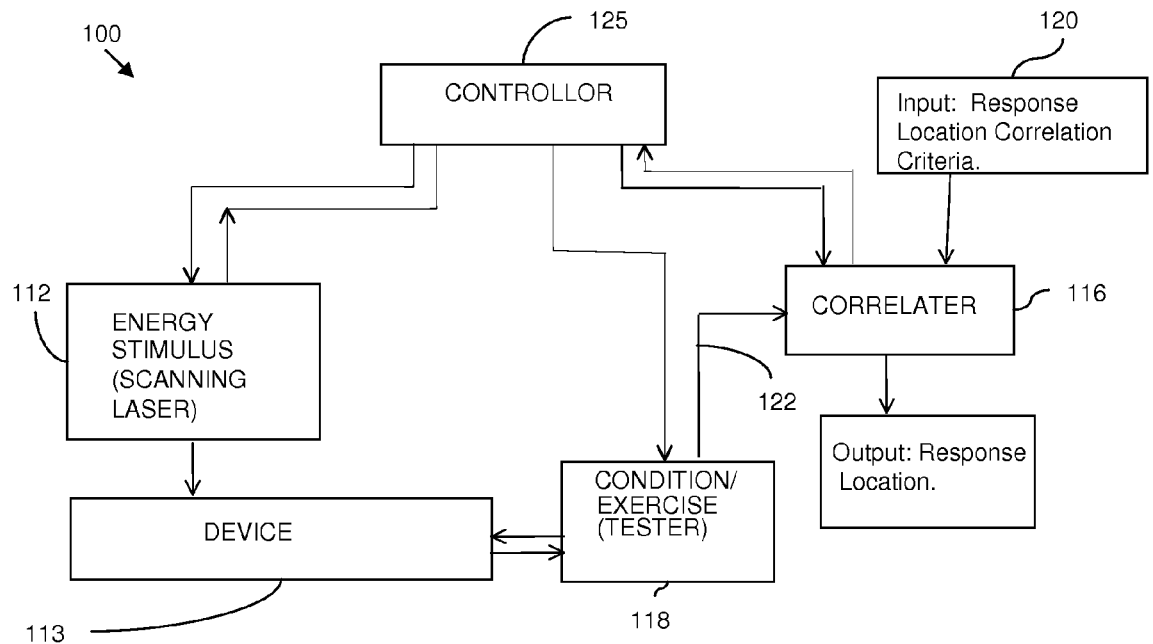
Figure 1  LSM Soft Response Localization: Block Diagram
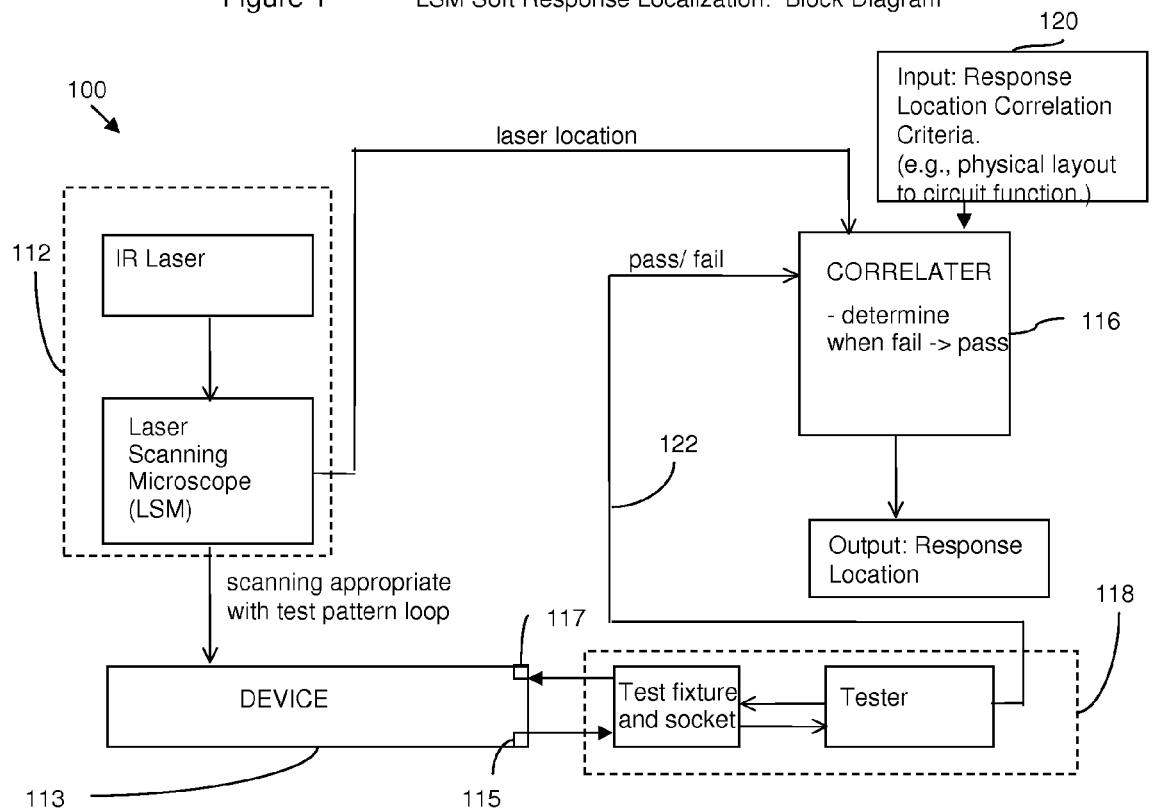
Figure 2  LSM Soft Response Localization: Implementation Block Diagram

SENSOR DIFFERENTIATED FAULT ISOLATION

CROSS-REFERENCE TO RELATED APPLICATIONS

This application is a division of U.S. application Ser. No. 10/907,787, filed on Apr. 15, 2005, now U.S. Pat. No. 7,202,689.

BACKGROUND OF THE INVENTION

1. Field of the Invention

The invention generally relates to an apparatus and method for diagnostically testing the circuitry of a device. More particularly, the present invention relates to an apparatus and method for determining the location of a response within the circuitry of a device and/or for tracing the connectivity of the circuitry of a device.

2. Description of the Related Art

Physical fault isolation techniques can be used to image an integrated circuit (IC), and possibly provide information about its operation. These techniques are often used in conjunction with an IC tester to control the state and operation of the IC. IC testers can condition and exercise an IC by generating test pattern signals selected to test for a particular response or to test a particular connectivity path in the circuitry of an IC, when the IC circuitry is stimulated with an applied energy. The tester repeatedly inputs the test pattern signals into input pins of the IC and remotely monitors the resulting pass/fail output signals at the output pins of the IC. One such IC fault isolation technique is Laser Scanning Microscopy (LSM) soft response analysis. LSM analysis can be performed on an IC that is being operated cyclically. The IC is biased at a point between passing operation and failing operation. Specific points in the LSM image can be linked to a change in the pass/fail criteria determined at the tester. This technique is specifically applicable to behaviors of an IC that are functions of temperature, voltage or timing. This approach relies on a 'local' stimulus (i.e., a laser) and uses a remote detector (i.e., a tester) to evaluate the pass/fail status of the device at one or more of its output pins. A related method is known as Laser Asissted Device Alteration (LADA).

Other laser-based IC fault isolation techniques include, Thermal Induced Voltage Alteration (TIVA) and Light Induced Voltage Alteration (LIVA). TIVA and LIVA techniques use changes in the power demands of an IC measured at a power or ground pin to identify when the heat or light, respectively, from a laser has activated or altered a response or circuit.

Another class of fault isolation techniques is used for measuring electrical activity in operating integrated circuits. This group may include electron beam probing or Electron Beam Test (EBT), Laser Voltage Probing (LVP), magnetic field or magnetic force microscopy, Photon Emission Microscopy (PEM), Time Resolved Emission (TRE), and Picosecond Imaging Circuit Analysis (PICA). These methods measure one or more parameters such as electric field, magnetic field, or photon emission that may be associated with the electrical voltage or current on a conductor in the integrated circuit.

SUMMARY OF THE INVENTION

This disclosure presents an apparatus and method for diagnostically testing the circuitry of a device. More particularly, this disclosure presents an apparatus and method for determining the location of a response within the circuitry of a device and/or for tracing the connectivity of the circuitry within a device.

One embodiment of the apparatus comprises a stimulating energy source for applying energy directly to a first location on a conditioned device. The first location being any first location from which the applied energy can affect the electrical activity within the circuitry being tested. The device can be an integrated circuit, a region of an integrated circuit, a region of circuitry on an integrated circuit, a specific circuit, or circuit element, a substrate of an integrated circuit, a multi-chip module, etc. The stimulating energy source can operate by applying energy without establishing a mechanical contact with the first location on the conditioned device. The stimulating energy source can comprise a laser, an electron beam, a magnetic field, an electric field, an acoustic source, an ion beam, and a particle source. Electrical activity is produced or altered in a circuit of the conditioned device in response to the applied energy. A sensor is connected to the conditioned device at a second location and adapted to detect a response indicator in the electrical activity in the circuit. The second location being any location from which the sensor can detect electrical activity in the circuitry being tested. The sensor can comprise a photonic sensor, a magnetic sensor, an electric field sensor, a temperature sensor or an acoustic sensor. The indicator can comprise a pass/fail indication, a change in performance indication, a change in temperature indication, or the presence or absence of electrical activity in the circuit at the sensor location. The correlater can be adapted to receive response location correlation criteria and/or circuit connectivity tracing criteria. Based upon the input criteria, software within the correlator correlates the location of the applied energy with the location of the sensor at the time the indicator was detected in order to determine the location of the response and/or to trace the connectivity of the circuitry. The apparatus can also comprise a tester. The tester can be adapted to condition the device by generating test pattern signals selected to test for a particular response within the circuitry of the device and to repeatedly input the test pattern signals into input pins of the device. A controller can be connected to the stimulating energy source, the sensor, the correlater and the tester. The controller can be adapted to control the timing and integration of the functional components of the apparatus. Specifically, the controller can be adapted to control the stimulating energy source, the sensor, the correlater and the tester during the diagnostic testing process.

An embodiment of the method for diagnostically testing circuitry within a device (e.g., an integrated circuit, a region of an integrated circuit, a region of circuitry on an integrated circuit, a substrate of an integrated circuit, a multi-chip module, etc.) comprises conditioning the device by generating test pattern signals selected to test for a particular response within the circuitry of the device and repeatedly inputting the test pattern signals into input pins of the device. Then, a stimulating energy is applied directly to the device at a first location that will affect the circuitry such that electrical activity is produced or altered within the circuitry of the device in response to the applied energy. Different processes may be used to apply the energy to the first location. The energy can be applied at a single fixed first location on the device. The energy can also be applied to multiple first locations by raster scanning, grid scanning, and full field scanning. Additionally, the energy can be applied to multiple first locations by stepping to different regions of the device. An indicator responsive of the applied energy, such as a pass/fail indication, a change in performance indication, a change in temperature indication, or a presence or absence of electrical activity, can be detected within the circuitry at a second location. Then, based upon established response location correlation criteria and/or circuit connectivity tracing criteria, the first location (i.e., location of the applied energy) is correlated with the second location (i.e., location of the sensor) at the time the indicator was detected, to determine the location of the response within the circuitry which produced the response indicator or to trace the connectivity of the circuitry, respectively.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which:

FIG. 1 is a schematic block diagram of an LSM soft response localization apparatus;

FIG. 2 is a schematic block diagram illustrating the implementation of the apparatus of FIG. 1;

DETAILED DESCRIPTION OF PREFERRED EMBODIMENTS OF THE INVENTION

Figure 3:
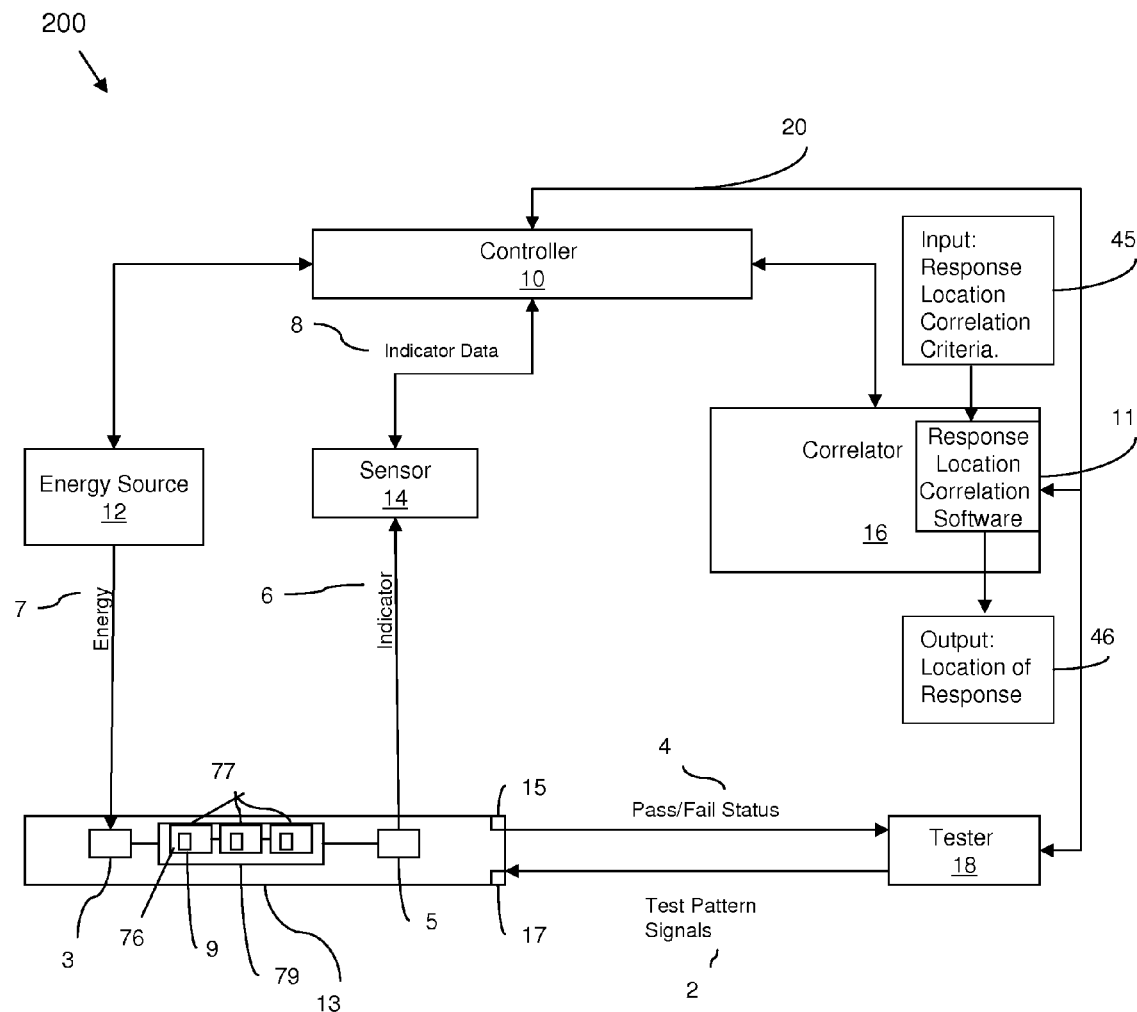
FIG. 3 is a schematic block diagram of one embodiment of a diagnostic testing apparatus of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As stated above, Laser Scanning Microscopy (LSM) soft response analysis is one technique for isolating particular responses on an integrated circuit (IC). Referring to FIGS. 1 and 2 in combination, the apparatus 100 and method of LSM soft response analysis incorporates the use of a laser scanning microscope 112 to inject a signal into a device 113. A tester 118 conditions the device by generating a test pattern loop and inputting the test pattern loop into the input pins 117 of the device 113. The tester 118 also remotely monitors pass/fail indications at the device output pins 115. Using input response location correlation criteria 120, correlation software in a correlater 116 attempts to determine the location of the circuitry within the device 113 that causes the response 122 based upon the location of the applied energy 112. A controller 125 is connected to and coordinates the functions of all the other components in the apparatus 100. This technique can be performed on an IC 113 that is being operated cyclically. The IC 113 is biased at a point between passing operation and failing operation. Specific points in the LSM image can be linked to a change in the pass/fail status of the IC determined by the tester 118 at the output pins 115. This technique is specifically applicable to behaviors of an IC that are functions of temperature, voltage or timing. This approach relies on a 'local' stimulus form energy source 112 (i.e., a laser) and uses a remote detector (a tester 118) to evaluate pass/fail status of one or more pins. However, there are a number of shortcomings with the LSM response analysis technique. Often biasing an IC 113 close to a pass/fail operation point is not possible because the IC performance may not be temperature, voltage or timing sensitive. The pass/fail criterion 120 may be difficult or impossible to isolate at the interface between the IC 113 output pin 115 and the tester 118. The full test pattern loop required to test for a particular response may increase the time required for the output sampling rate such that it takes too long for optimal image collection. Also, the digital signal at the device 113 output 115 is not as sensitive as the analog signals internal to the device 113 that are altered by the applied energy 112. Thermal Induced Voltage Alteration (TIVA) and Light Induced Voltage Alteration (LIVA) may also be used for diagnostic testing. TIVA and LIVA use changes in the power demands of an IC measured at a power or ground pin to identify when the heat or light, respectively, from a laser has activated a particular response. A major disadvantage of this technique is that the laser can unintentionally affect other circuits, inducing them to produce a signal that is difficult to differentiate from that of the response indicator for the particular response being tested. The changes in the power demand due to unintended signals from other circuits obscure the changes in the power demand due to the particular response being tested. TIVA and LIVA are best suited to identifying short-circuit responses on simple passive circuits such as serpentines and combs. TIVA and LIVA are suboptimal in general for diagnosing functional fails or fails on complex devices. There are also implementation limitations for these techniques, such as requiring signal isolation to a device pin.

U.S. Patent Application, Publication No. US2003/0146761, of Pakdaman et al., published on Aug. 7, 2003, and incorporated herein by reference, discloses an apparatus and method for diagnostic testing of integrated circuits. Specifically, the Pakdaman et al. application discloses applying energy to a receiver located at a known (i.e., predetermined)

location on a wafer. In the receiver the energy is amplified, conditioned or buffered and then passed to the circuit on the wafer that is being tested. The electrical activity in the circuit is then sensed by an electrical activity detector to determine the characteristics of the circuit. The requirement that the applied energy be picked up first by a receiver is a significant implementation limitation.

In view of the foregoing, this disclosure presents an improved apparatus and method for isolating a particular physical response responsible for an integrated circuit failure or change in performance. The method and apparatus of the present invention may further be used to trace the connectivity of a particular circuit or circuits in the device.

Referring to FIG. 3, the apparatus 200 operates to determine the exact location 9 of a response (e.g., a failure or change in performance) within the device 13. Specifically, apparatus 200 operates to determine the first or most sensitive location 9 of a response. A tester 18 can condition the device 13, monitor the pass/fail status 4 of the device 13 at the output pins 15 and then communicate a failure indicator 20 to a correlator 16. The correlator 16 can determine the circuitry 79 within the device 13 that is causing a failure or a change in device performance. Energy 7 is applied to the device 13 by energy source 12 at any first location 3 on the device such that the energy passes to the circuitry 79 and produces a response. In particular, the apparatus does not require the use of a receiver on the device 13 to first receive the applied energy 7 before passing it on to a circuit being tested. Thus, the energy 7 may be applied to the device 13 at any location, independent of any other structure connected to the device 13. A localized sensor 14 can be positioned on the device 13 in a location (i.e., second location 5) where an indicator 6 of the response can be detected. The sensor 14 processes the detected indicator 6 to produce indicator data 8 such as a waveform 19 (see FIG. 4) or a pass/fail indication 47 (see FIG. 6). The localized sensor 14 can be positioned closer to the probable response location 9 than the output pins 15 connected to the tester 18 so that a more accurate determination can be made as to whether the device 13 failure or change in performance and the response of circuitry 79 to the stimulus (energy 7) are related. For example, instead of waiting for the propagation of a failing digital signal 4 from the output pin(s) 15 of a stimulated device 13 to the tester 18, a sensor 14 (e.g., a light-sensing probe such as an avalanche photo-diode (APD) and associated optics) could be used to directly examine a local failure response within the device 13 (e.g., at second location 5). The location (i.e., first location 3) of the stimulus (i.e., applied energy 7) can be independent of the measurement. The indicator data 8 and the locations 3, 5 of the energy 7 and sensor 14 are communicated to the correlator 16 and analyzed.

More particularly, the apparatus 200 comprises a stimulating energy source 12 for applying energy 7 directly to any first location 3 on a conditioned device 13 which will affect the conductivity of the circuitry 79 within which the circuit element 76 or region of circuitry 77 causing the failure or change in performance behavior is most likely located (i.e., location 9). The first location 3 may be either upstream or downstream of the probably location 9 of the response causing the failure or change in performance behavior of the device 13. In particular, the apparatus 200 does not require the use of a receiver at a known location on the device 13 to first receive the applied energy 7 before passing it on to the circuitry 79 being tested. Thus, the energy 7 can be applied directly to the device 13 at any location independent of any other structure connected to the device 13. The circuitry 79 comprises multiple regions of circuitry 77 each comprising at least one circuit element 76. The location 9 can comprise one of the multiple regions of circuitry 77 within the circuitry 79. The energy 7 can be directed towards any first location 3 on the device 13 where the energy 7 can affect the electrical activity within the circuitry 79 and can thereby produce a response within the circuitry 79 or, more particularly, produce a response within a circuit element 76 or region of circuitry 77 within the circuitry 79. The device 13 can be an integrated circuit, a region of an integrated circuit, a region of circuitry on an integrated circuit, a substrate of an integrated circuit, a multi-chip module, etc. The stimulating energy source 12 can operate by applying energy 7 without establishing a mechanical contact with the first location 3 on the device 13. The stimulating energy source 12 can comprise a laser (e.g., thermal or visible), an electron beam, a magnetic field, an electric field, an acoustic source, an ion beam, a particle source (e.g., alpha particle source), etc. For example, changes in the conductivity (i.e., electrical activity) of one or more elements 76 can be produced within the circuitry 79 in response to the applied energy 7.

The apparatus 200 further comprises a sensor 14 operably connected to the device 13 at a second location 5 and adapted to detect a response indicator 6 within the circuitry 79. The second location 5 of the sensor 14 can be located at any position on the device 13 where a response indicator 6 can be detected within the circuitry 79. The sensor 14 can comprise a photonic sensor (e.g., photon emission microscopy (PEM), pico-second imaging circuit analysis (PICA)), a magnetic sensor to measure current (e.g., a superconducting quantum interference device (SQUID), magnetoresistive, Hall effect, etc.), an electric field sensor (e.g., electron detector), a temperature sensor or a scanned probe sensor (e.g., an atomic force microscopy (AFM) probe, etc.). The response indicator 6 can comprise a pass/fail indication or a change in performance indication at the location 5 of the sensor 14. The response indicator 6 can also comprise the presence or absence of electrical activity or a change in temperature at the location 5 of the sensor 14. The sensor 14 can further be adapted to process the indicator 6 into indicator data 8 (e.g., pass/fail data 47 of FIG. 6, a waveform 19 of FIG. 4, etc.).

Additionally, the apparatus 200 comprises a correlater 16 operably connected to both the sensor 14 and a tester 18 (discussed below). The correlater 16 is configured with response location correlation software 11 adapted to determine which circuitry 79 or region of circuitry 77 within circuitry 79 is most likely causing device failure or change in performance behavior based upon the known construction of the device 13. The response location correlation software 11 is further adapted to determine the exact failure response location 9 within that circuitry 79 based upon feedback from the energy source 12 and the sensor 14. More particularly, the correlator 16 is adapted to receive a fail indication 20 from the tester 18 (e.g., either directly or via a controller 10) and using the correlation software 11 to determine which circuitry (e.g., circuitry 79) is responsible for the failure or change in performance behavior. Then, the energy source 12 and the sensor 14 may be located such that energy 7 passes to this circuitry 79 and a response can be detected within this circuitry 79, respectively.

Indicator data 8 and the locations of the energy source 12 (i.e., first location 3) and the sensor 14 (i.e., second location 5) at the time the indicator 6 was detected, are communicated to the correlator 16. For example, the sensor 14 may transmit its location 5 at the time the indicator was received and, if necessary the indicator data 8 (e.g., pass/fail indication 47 (see FIG. 4), waveform 19 (see FIG. 6), etc.) directly to the correlator 16 or via a controller 10. Similarly, the energy source 12 may transmit its location 3 to the correlator 16 directly or via a controller 10. Response location correlation criteria 45 input into the correlation software 11 is then used to determine the exact response location 9 (i.e., the circuit element 76 or region of circuitry 77 that produced the response causing the response indicator 6) by correlating the first location 3 with the second location 5 at the time the response indicator 6 was detected. The correlater 16 may be adapted to determine the location of the response 9 in either real-time or post-process. The correlater 16 may output 46 the response location 9 by forming a pass/fail image map corresponding to the response amplitude at each location 3 at which energy was applied (see FIG. 9, discussed below) or the output 46 may be a record of the response location 9 (e.g., alpha-numeric coordinates associated with specific locations on the device (not shown)) without creating an image.

As stated above, the apparatus 200 can also comprise the tester 18 and the controller 10. The tester 18 can be adapted to condition the device 13 and, specifically, the circuitry 79 within the device 13 by generating test pattern signals 2 selected to test for (i.e., activate) the particular failure response within the circuitry 79 (i.e., the response causing the failure or change in performance behavior of the device 13) and to repeatedly input the test pattern signals 2 into input pins 17 of the device 13. The tester 18 can further be adapted to monitor the output pins 15 for pass/fail indications 4 from the device 13 and to transmit those fail indications 20 to the correlator 16. The fail indications 20 are analyzed by the response location correlation software 11, as discussed above, to determine the particular circuitry 79 within which the failure response is probably located and, thus, to determine the most suitable locations for applying the energy 7 and connecting the sensor 14. The tester 18 may comprise a separate component, as illustrated, and on-chip control circuitry, probes, power/ground connections, etc. A controller 10 can be connected to the stimulating energy source 12, the sensor 14, the correlater 16 and the tester 18 and can be adapted to control the coordination (i.e., timing and integration) of the functional components of the apparatus 200. Specifically, the controller 10 can be adapted to control the timing and communication between one or all of the stimulating energy source 12, the sensor 14, the correlater 16 and the tester 18, during the diagnostic testing process.

Figure 4:
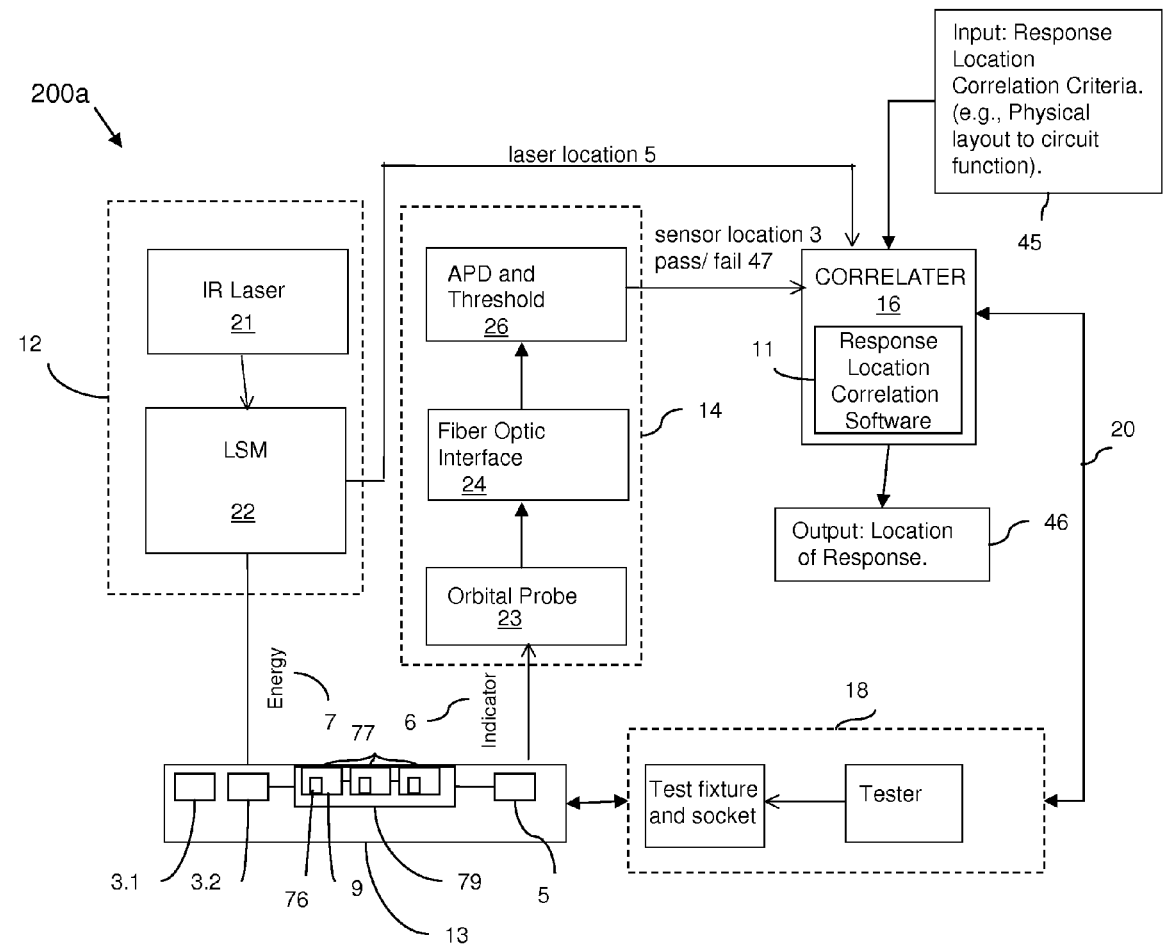
FIG. 4 is a schematic implementation block diagram of an exemplary apparatus of the embodiment of FIG. 3.
Figure 5:
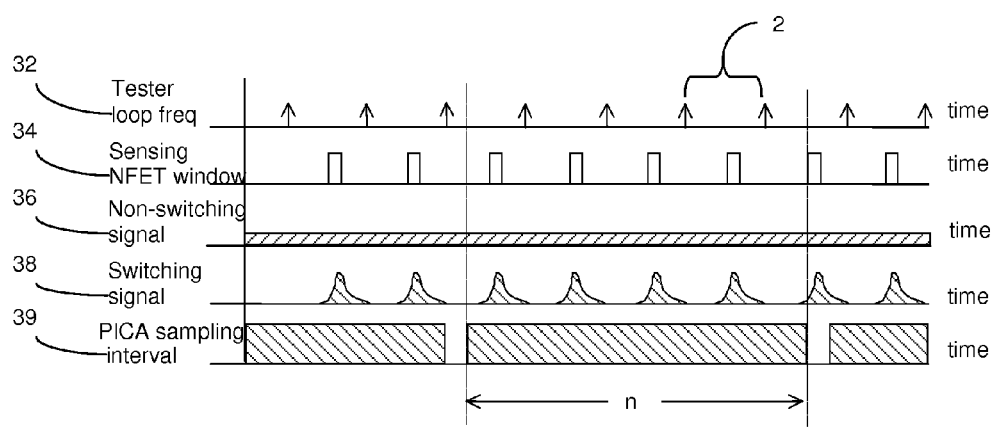
FIG. 5 is a schematic graph illustrating signals associated with the apparatus of FIG. 4.

Referring to FIG. 4, in an exemplary embodiment 200a of the apparatus 200 a stimulating energy source 12 may comprise an infra-red (IR) laser 21 and a laser scanning microscope (LSM) 22. The sensor 14 of the apparatus 200a may comprise a photonic sensor including an orbital optical probe 23 fixed to a fiber optic interface 24 connected to an avalanche photo diode (APD) 26. The manner of scanning should be appropriate for the particular sensor 14 being used. For example, in this embodiment an IR laser 21 is used to scan the device 13 in a raster fashion (i.e., running the laser beam in a path back and forth over the device 13 and scanning multiple first locations 3.1, 3.2, etc. in the scan path (e.g., See FIG. 10, discussed below)). The thermal energy 7 from the laser 21 will change the conductivity of one or more elements 76 within the circuitry 79 of the integrated circuit (i.e., device 13) and, thereby, change the circuit behavior either upstream or downstream of the location 3 of the applied energy 7. Alternatively, the heat produced by the laser 21 can change one or more of the operating parameters of the device 13. The response as indicated by response indicator 6, such as a pass/fail indication or a change of performance indication, etc. of the device 13 is observed at a second location 5. The second location 5 may be a fixed location such as a buffer downstream of the failing circuitry 79. The output of the APD 26 to the correlator 16 is set to a threshold in order to create a pass/fail signal 47 (indictor data 8) that is transmitted to the correlater 16 along with the location 3 of the IR laser 21 and the location 5 of the probe 23 at the time the response indicator 6 was detected. Based upon response location correlation criteria 45 input (e.g., user input or pre-programmed) into the correlation software 11, the locations 3, 5 of the energy and the sensor are correlated to determine the location 9 of the response within the circuitry 79 (e.g., a region of circuitry 77 comprising one or more circuit elements 76 within circuitry 79). Referring also to FIG. 5, exemplary signals that may be monitored during diagnostic testing using the apparatus 200a of FIG. 4 are illustrated. A test pattern 2 loop is generated by tester 18 to test for a particular response (e.g., NFET response) and the test pattern 2 is repeatedly applied to the device 13. The tester pattern loop frequency 32 shows the beginning of each pattern loop. The Sensing NFET window 34 shows the time interval after the beginning of the tester pattern 2 when the NFET targeted might switch. The non-switching signal 36 depicts the signal that the APD 26 of sensor 14 would typically measure if the NFET did not switch. The switching signal 38 depicts the signal that the APD 26 would typically measure if the NFET did switch. The PICA probe 23 sampling interval 39 is indicated as n number of pattern cycles, where n depends on the PICA probe 23, the scanning speed, NFET technology, and other parameters.

Figure 6:
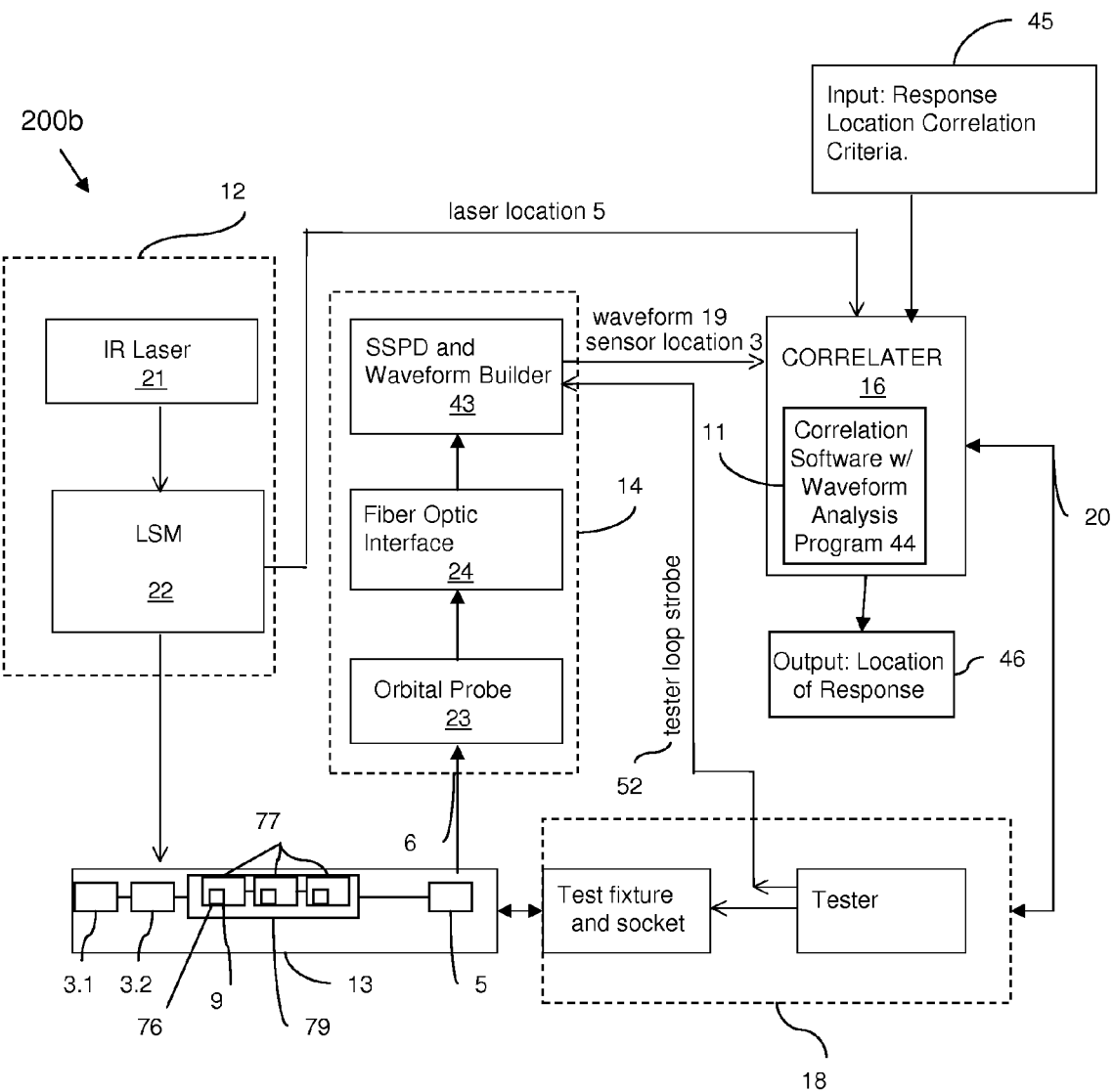
FIG. 6 is a schematic implementation block diagram of another exemplary apparatus of the embodiment of FIG. 3.
Figure 7:
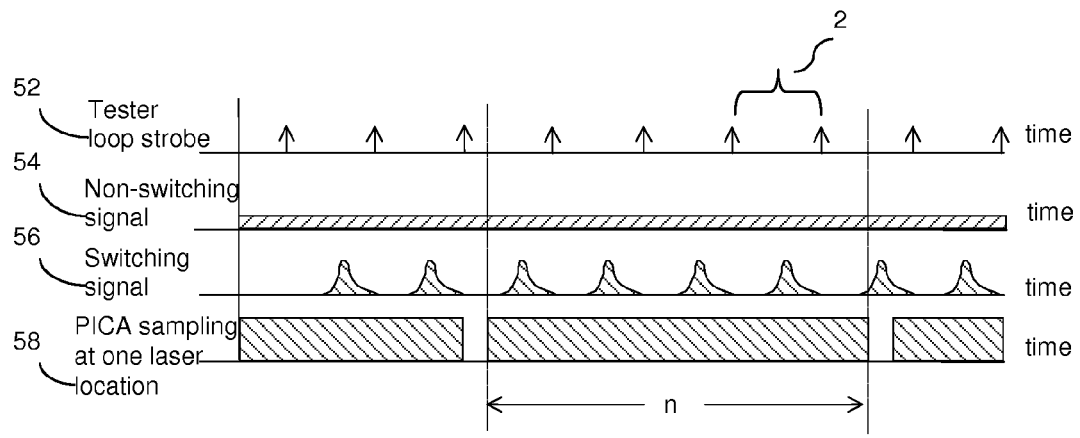
FIG. 7 is a schematic graph illustrating signals associated with the apparatus of FIG. 6.
Figure 10:
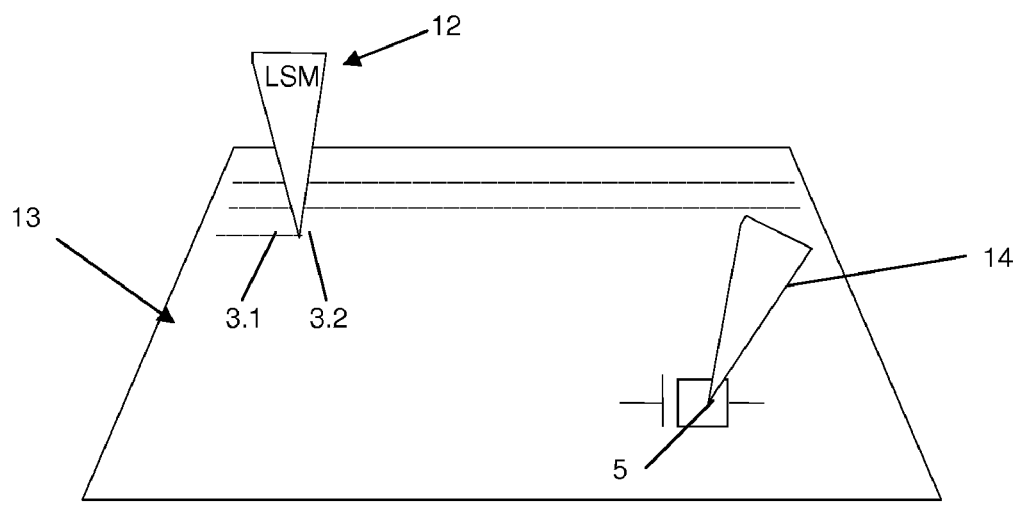
FIG. 10 is a schematic perspective view drawing illustrating the apparatus of FIG. 6.
Figure 11:
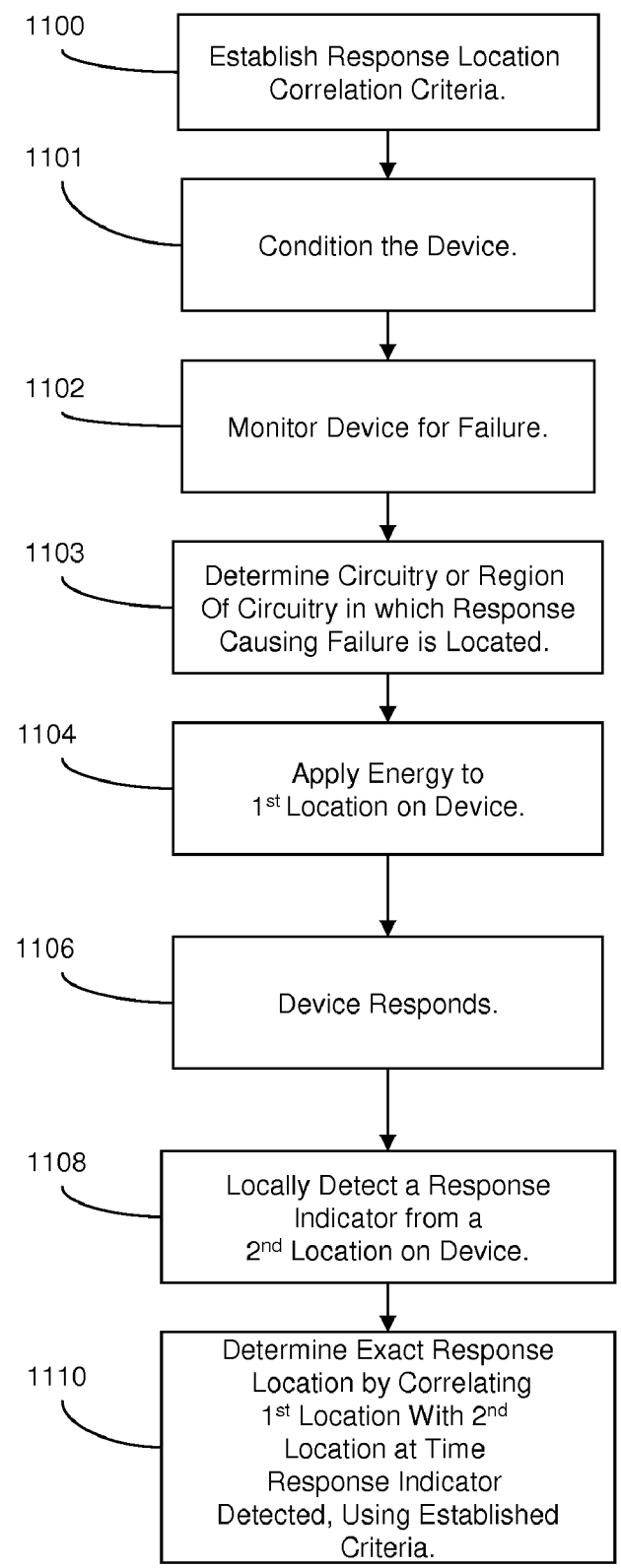
FIG. 11 is a schematic flow diagram illustrating one embodiment of the method of the present invention.

Referring to FIG. 6, in another embodiment 200b of the apparatus 200, the stimulating energy source 12 of the apparatus 200b may also comprise an infra-red (IR) laser 21 and a laser scanning microscope (LSM) 22 and function as described above. The sensor 14 of the apparatus 200b may also comprise a photonic sensor 14. The photonic sensor 14 may include an orbital optical probe 23 fixed to a fiber optic interface 24 connected, not to an APD 26, but rather to a super conducting single photon detector (SSPD) and a waveform builder 43. The manner of scanning in the energy 7 should be appropriate for the waveform builder 43. For example, in this embodiment 200b, scanning may be accomplished using a raster scanning method, as illustrated in FIG. 10, or another scanning method in which the stimulating energy source 12 (i.e., laser 21/LSM 22) scans multiple first locations 3.1, 3.2, etc., as it moves across the device 13. Referring to FIG. 7, exemplary signals that may be monitored during diagnostic testing using apparatus 200b of FIG. 6 are illustrated. A test pattern 2 loop that targets a particular NFET response is generated by tester 18 and is repeatedly applied to the device 13. Additionally, a tester pattern loop strobe 52 is sent to the waveform builder 43 to mark the beginning of each test pattern 2 loop and, thus, the frequency of the test pattern 2 loop. The non-switching signal 54 depicts the signal that the sensor 14 would typically measure if the NFET did not switch. The switching signal 56 depicts the signal that the sensor 14 would typically measure if the NFET did switch. The PICA probe 23 sampling interval 58 at one laser location (e.g., first location 3.1) is indicated as n number of pattern cycles, where n depends on the probe 23, the scanning speed, the NFET technology, and other parameters.

Figure 8:
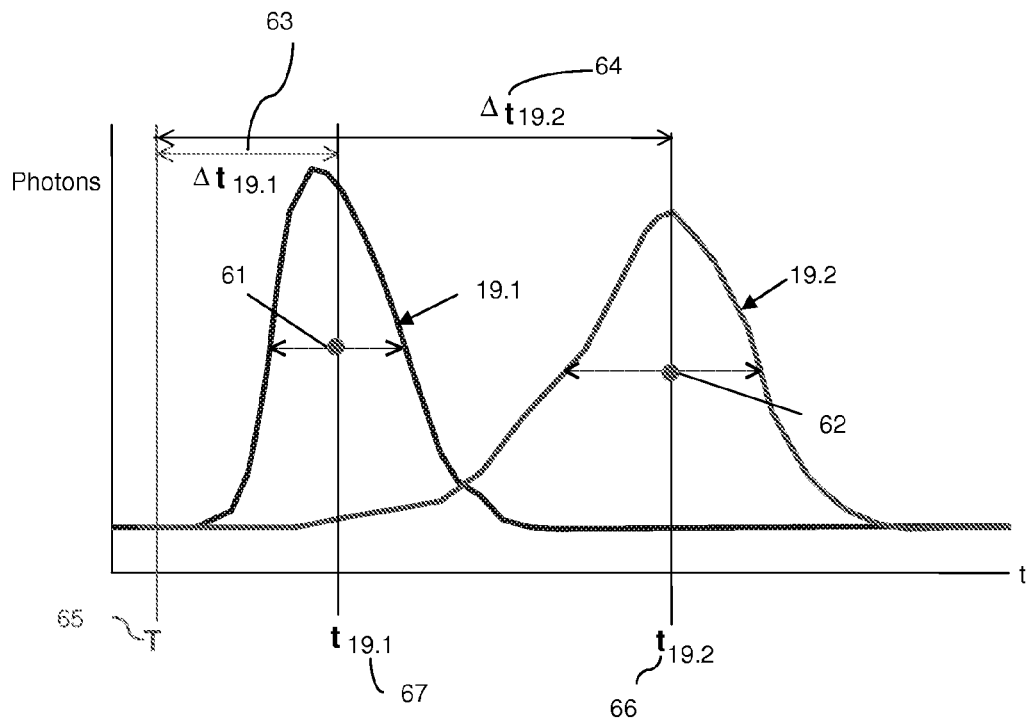
FIG. 8 is a schematic graph illustrating an exemplary PICA waveform associated with the apparatus of FIG. 6.
Figure 9:
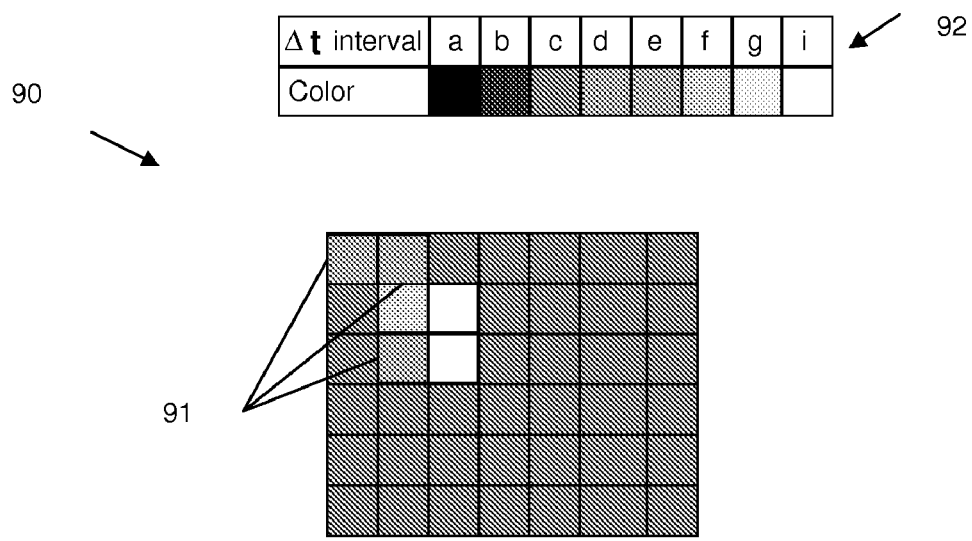
FIG. 9 is schematic drawing illustrating an exemplary diagnostic testing output image.

Referring also to FIG. 8, the SSPD and waveform builder 43 create a PICA waveform 19 (e.g., 19.1, 19.2, etc.) for each location 3.1, 3.2, etc. scanned by the energy source 12 (e.g., laser 21/LSM 22). For illustration purposes, the waveform analysis process is described herein with reference to two waveforms 19.1 and 19.2; however, analysis of multiple waveforms is anticipated. The indicator data 8 (e.g., the waveforms 19.1, 19.2, etc.), the first location 3.1, 3.2, etc. of the applied energy 7, and the second location 5 of the sensor 14 at the times the response indicators 6 were detected, are transmitted to the correlator 16 (e.g., by the controller 10 or directly from the sensor 14 and the energy source 12). Specifically, the waveforms 19.1, 19.2 etc. are transmitted to a waveform analysis program 44 in the correlation software 11 as are the locations 3.1, 3.2 etc of the energy 7 and the location 5 of the sensor 14. Response location correlation criteria 45 input into the correlater 16 can set the timing edge of a reference signal at a point in time T (65) with a +/−Δt 63, 64 for each waveform 19.1, 19.2, respectively, where t is the point 67, 66 in time at which the center of the full width at half max (FWHM) occurs for each waveform 19.1, 19.2, respectively, and Δt 63, 64 is the difference between the reference point T (65) and the FWHM mid-point 61, 62. The waveform analysis program 44 of the correlation software 11 determines the switching time or delay for each waveform 19.1, 19.2 as the difference Δt 63, 64 between the full width half max (FWHM) mid-point 61, 62 for each waveform 19.1, 19.2 and the reference point in time T 65, and correlates the occurrence of this delay Δt 63, 64 with the first location 3.1, 3.2 of the infrared laser energy 7 at the time the Δt 63, 64 occurs. Thus, a response causing a delay Δt would be activated at the precise moment the energy source 12 scans over it, thereby effecting a shift in time Δt of the waveform measured by the SSPD, for example. The location of the energy source 12 (e.g., 3.1 or 3.2) at the time this effect occurs would thereby identify the location 9 of the response (e.g., a region of circuitry 77 comprising one or more circuit elements 76 within the circuitry 79). Other waveform analyses may also be used to locate the response. Referring to FIG. 9, for example, the FWHM mid-point for each waveform 19.1, 19.2 may be used to form an image 90 of laser location compared to Δt. Each pixel 91 of the image 90 represents an area stimulated by the laser 21. The amplitude of the response is then coded into the picture (e.g., by color coding, grayscale coding, etc., as illustrated by code key 92). The correspondence can be linear, exponential, or some other scaling. Alternatively, because the waveform width and shape are related to slew rate, a width measurement, area integration, or some other algorithm may used to determine response location.

Referring to FIGS. 3, 4, 6 and 11 in combination, an embodiment of the method for isolating the location of a response on a device 13 (e.g., an integrated circuit, a region of an integrated circuit, a region of circuitry on an integrated circuit, a substrate of an integrated circuit, a multi-chip module, etc.) comprises establishing response location correlation criteria 45 and inputting the criteria 45 into correlation software 11 of a correlator 16 (1100). The response location correlation criteria 45 may be user supplied or preprogrammed into the software 11. The device 13 is conditioned by generating test pattern signals 2 selected to test for a particular response in the device causing device failure or a change in behavior and repeatedly inputting the test pattern signals 2 into input pins 17 of the device 13 (1101). Conditioning the device 13 may be accomplished by using, for example, an external tester 18 and on-chip control circuitry, power/ground connections, etc. Pass/fail indications 4 can be monitored by the tester 18 at the output pins 15 of the device (1102) and failure indicators 20 may be transmitted to the correlator 16. The correlator 16 can determine, using correlation software 11, the circuitry 79 or region of circuitry 77 within circuitry 79 most likely responsible for the causing the failure or change in performance behavior (1103). Energy 7 is then applied to the conditioned device 13 by a stimulating energy source 12 at a first location 3 (1104). The energy may be in the form of light, heat, magnetic field, electric field, etc. The first location 3 should be determined such that the energy 7 is applied to any first location 3 wherein the energy 7 can affect the electrical activity in the circuitry 79 and can thereby produce a failure response within the circuitry 79 or, more particularly, produce a failure response within a circuit element 76 or region of circuitry 77 within the circuitry 79. The stimulating energy source 12 can apply energy 7 without establishing a mechanical contact with device 13. The location 3 of the applied energy is independent of any other structure on the device 13. In particular, the method does not require the use of a receiver on the device 13 to first receive the applied energy 7 before passing it on to a circuit being tested. Different processes may be used to apply the energy 7 to the first location 3. The process used should be appropriate for the particular sensor 14 being used. The energy 7 can be applied at a fixed first location 3 on the device 13. The energy 7 can also be applied to multiple first locations (e.g., 3.1, 3.2, etc.) by raster scanning, grid scanning, full field scanning or by stepping to different asymmetrical regions of the device 13, such that the energy 7 is applied to the device 13 at multiple locations in a pattern. In response to the applied energy 7 a change in the conductivity of one or more elements can be produced within the conditioned device 13 (1106). A response indicator 6, such as a pass/fail indication, a change in device performance indication, or a change in temperature indication, can be locally detected in the response produced by the applied energy within the circuitry 79 (1108). A response indicator 6 may also be considered a lack of electrical activity at the sensor location 5. Specifically, a local sensor 14 is used to detect a response indicator 6 at a second location 5 other than the location of the output pins 15 of the device 13. The second location 5 should be selected such that a response can be detected within the circuitry 79 or region of circuitry 77 within which the failure response is most likely located (see 1103). For example, the sensor 14 may be placed in a fixed location 5, such as a buffer downstream of circuitry 79 that is believed to be failing. Using the input response location correlation criteria 45, the location 9 of the response (e.g., a region of circuitry 77 comprising one or more circuit elements within the circuitry 79) which produced the response indicator 6 can be isolated (i.e., determined) by correlating the first location 3 of the applied energy 7 with the second location 5 of the sensor 14 at the time the response indicator 6 was detected by sensor 14 (1110). The location 9 of the response can be determined either in real-time or post-process.

Figure 12:
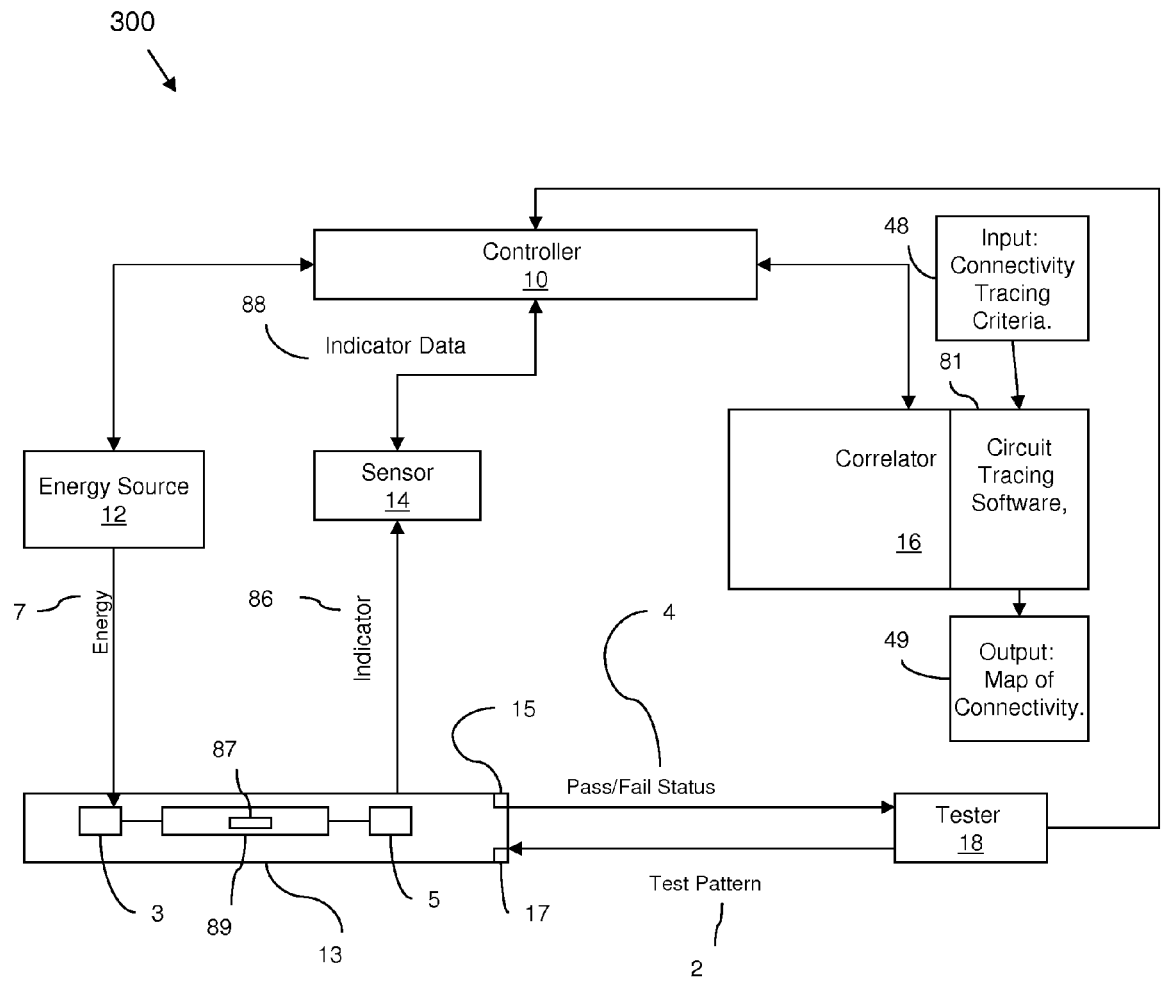
FIG. 12 is a schematic block diagram of another embodiment of a diagnostic testing apparatus of the present invention.
Figure 13:
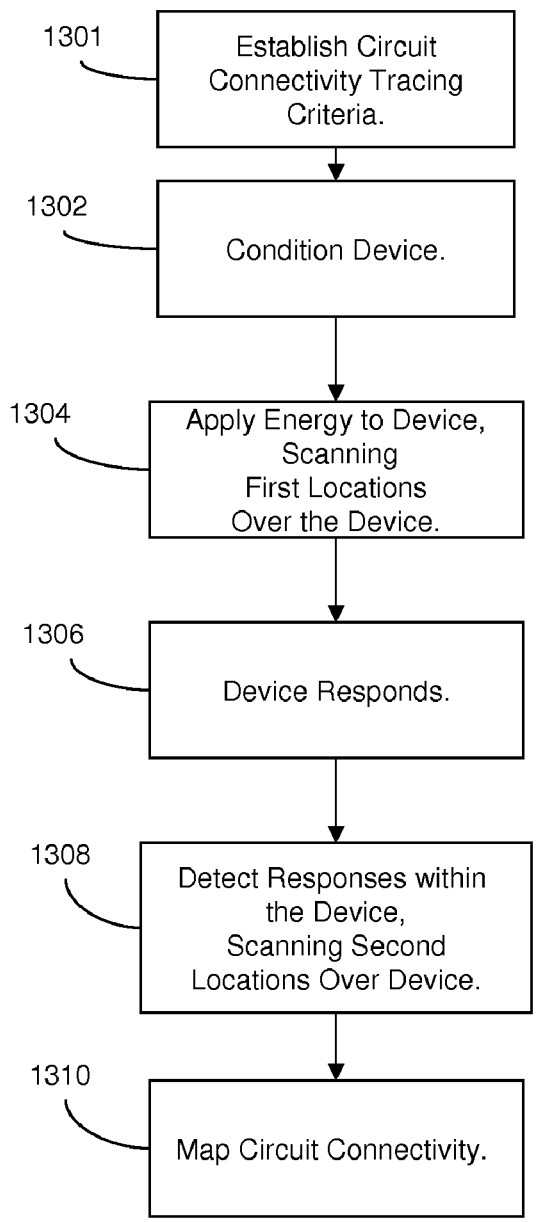
FIG. 13 is a schematic flow diagram illustrating another embodiment of the method of the present invention.

In addition to isolating responses causing device failures, embodiments of the apparatus and method of the present invention may be used to trace circuit connectivity (See FIGS. 12-13). Referring to FIG. 12, the circuit tracing apparatus 300 similarly comprises an energy source 12, a sensor 14, a tester 18, a controller 10 and a correlator 16. However, instead of being configured with response location correlation software 11, the correlator 16 is configured with circuit tracing software 81. Referring to FIGS. 12 and 13 in combination, in using the method and apparatus 300 of the present invention to trace circuit connectivity, circuit connectivity tracing criteria 48 are established (1301). The device 13 is then conditioned (1302), as described above with regard to the response location embodiments of FIGS. 3-11, with test patterns 2 selected to activate a particular circuit 89. Then, energy 7 is applied to the device 13 by scanning first locations 3 over the device 13 (1304). As with the previously described method, this embodiment of the method does not require the use of a receiver on the device 13 to first receive the applied energy 7 before passing it on to a circuit 89 being traced. In response, electrical activity is produced within circuitry 89 within the device 13 (1306). Simultaneously, the sensor 14 is used to scan second locations 5. The second locations can be either upstream or downstream of the applied energy and are determined such that the sensor 14 is able to detect responses in the electrical activity within circuitry 89 (1308). For example, sensor 14 can be positioned downstream of a targeted circuit connection 87 being tested within circuitry 89 in order to detect an electrical response from the targeted circuit connection 87. The energy 7 can be applied and the sensor 14 can be positioned in a scanning manner over the device 13 using the same grid pattern to form a correlation matrix to test the connectivity of a plurality of circuit connections 87 within circuitry 89. Indicators 86 (e.g., electrical activity or a lack thereof) are sensed at multiple second locations 5 on the grid by sensor 14 in response to energy 7 applied at multiple first locations 3 on the grid. The indicators 86 are processed by the sensor 14 and indicator data 88 (e.g., pass/fail indicators, waveforms, etc.) are communicated to the correlator 16. The location 3 of the applied energy 7 and the location 5 of the sensor 14 at the time when the electrical response indicator 86 was detected are also transmitted to the correlator 16. The indicator data 88 and the locations 3, 5 are analyzed by circuit tracing software 81. The circuit tracing software 81, using input circuit connectivity tracing criteria 48, correlates the first locations 3 with the second locations 5 when electrical activity indicators 86 were detected and outputs a map of circuit connectivity 49 (1310). For example, a field programmable gate array (FPGA) on an integrated circuit can be conditioned to a particular routing configuration. Current may be induced at a particular location, using an optical laser or electron-beam. The resulting current sinks may be detected by scanning a SQUID or other suitable magnetic field sensor over the device.

Thus, the present invention provides an integrated solution to the problem of isolating the location of a particular physical response on a device, such as a response responsible for a device failure or change in performance. The apparatus and method incorporate the use of energy that is applied to any first location on the device where the energy can affect the electrical activity in the circuitry being tested and can cause an indicator of a response within the circuitry. A local sensor is positioned at a second location on the device where an indicator of the response can be detected within the circuitry. Using response location correlation criteria, the exact location of the response causing the failure or change in performance behavior within the circuitry can be determined by correlating the location of the applied energy and the location of the sensor at the time the response indicator was detected by the sensor. The present invention similarly provides an integrated solution to the problems associated with tracing circuit conductivity. The present invention also provides an integrated solution to the problem of injecting a signal into any desired location on an integrated circuit and measuring the resulting effects of that signal on any other desired location on an integrated circuit without having to contact the integrated circuit with a mechanical probe or other type of solid device to transfer energy to or measure energy from the integrated circuit.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the invention can be practiced with modification within the spirit and scope of the appended claims.

What is claimed is:

1. A method for diagnostically testing circuitry of a device, said method comprising:
    conditioning said device to activate a response within said circuitry;
    applying a stimulating energy source directly to any first location on a surface of said device such that electrical activity in said circuitry is affected producing an indicator of said response;
    locally detecting, by a sensor, said indicator of said response within said circuitry, wherein said sensor is located on said surface of said device at a specific second location different from said first location;
    correlating said first location on said surface of said device with said specific second location on said surface of said device in order to determine at least one of a location within said circuitry responsible for said response and a connectivity of said circuitry, based on preset criteria and said indicator,
    wherein said first location is independent of a location of any other structure connected to said device.

2. The method according to claim 1, all the limitations of which are incorporated herein by reference, further comprising:
    establishing response location correlation criteria,
    wherein said correlating further comprises, based upon said response location correlation criteria, correlating said first location with said specific second location at a time said indicator was sensed by said sensor to determine said location within said circuitry responsible for said response, and
    wherein said indicator comprises an indication of at least one of a failure, a change in performance, a change in temperature, and a lack of electrical activity from within said circuitry.

3. The method according to claim 1, all the limitations of which are incorporated herein by reference, further comprising:
    establishing circuit connectivity tracing criteria,
    wherein said correlating further comprises, based upon said circuit connectivity tracing criteria, correlating said first location with said specific second location at a time said indicator was sensed to trace said connectivity of said circuitry, and
    wherein said indicator comprises an indication of at least one of electrical activity and a lack of electrical activity.

4. The method according to claim 1, all the limitations of which are incorporated herein by reference, wherein said conditioning of said device further comprises conditioning said device by generating test pattern signals selected to activate said response within said circuitry and repeatedly inputting said test pattern signals into input pins of said device.

5. The method according to claim 1, all the limitations of which are incorporated herein by reference, wherein said applying of said stimulating energy source comprises at least one of applying said energy source at a fixed location on said device, applying said energy source to multiple first locations by stepping to different regions on said device, applying said energy source to multiple first locations by raster scanning, applying said energy source to multiple first locations by grid scanning, and applying said energy source to multiple first locations by full field scanning.

6. A method for diagnostically testing circuitry of a device, said method comprising:

conditioning said device to activate a response within said circuitry;

applying a stimulating energy source directly to any first location on a surface of said device such that electrical activity in said circuitry is affected producing an indicator of said response;

locally detecting, by a sensor, said indicator of said response within said circuitry, wherein said sensor is located on said surface of said device at a specific second location different from said first location and wherein said sensor is not electrically connected to said device; and correlating said first location on said surface of said device with said specific second location on said surface of said device at a time said indicator was sensed to determine a location within said circuitry responsible for said response, wherein said first location is independent of a location of any other structure connected to said device.

7. The method according to claim 6, all the limitations of which are incorporated herein by reference, further comprising:

establishing response location correlation criteria, wherein said correlating is based upon said response location correlation criteria, and wherein said indicator comprises an indication of at least one of a failure, a change in performance, a change in temperature, and a lack of electrical activity from within said circuitry.

8. The method according to claim 6, all the limitations of which are incorporated herein by reference, further comprising:

establishing circuit connectivity tracing criteria; and based upon said circuit connectivity tracing criteria, correlating said first location on said device with said specific second location on said device at said time said indicator was sensed to trace and determine connectivity of said circuitry, wherein said indicator comprises an indication of at least one of electrical activity and a lack of electrical activity.

9. The method according to claim 6, all the limitations of which are incorporated herein by reference, wherein said conditioning of said device further comprises conditioning said device by generating test pattern signals selected to activate said response within said circuitry and repeatedly inputting said test pattern signals into input pins of said device.

10. The method according to claim 6, all the limitations of which are incorporated herein by reference, wherein said applying of said stimulating energy source comprises at least one of applying said energy source at a fixed location on said device, applying said energy source to multiple first locations by stepping to different regions on said device, applying said energy source to multiple first locations by raster scanning, applying said energy source to multiple first locations by grid scanning, and applying said energy source to multiple first locations by full field scanning.

11. A method for diagnostically testing circuitry of a device, said method comprising:

inputting test pattern signals into input pins of said device;

monitoring output pins of said device for a fail indication;

determining, based on said fail indication, which circuitry within said device requires diagnostic testing;

applying a stimulating energy source directly to any first location on a surface of said device, without contacting said device, such that electrical activity in said circuitry is affected producing an indicator of said response;

locally detecting, by a sensor, said indicator of said response within said circuitry, wherein said sensor is located on said surface of said device at a specific second location different from said first location and wherein said sensor is not electrically connected to any of said output pins; and correlating said first location on said surface of said device with said specific second location on said surface of said device at a time said indicator was sensed to determine a location within said circuitry responsible for said response, wherein said first location is independent of a location of any other structure connected to said device.

12. The method according to claim 11, all the limitations of which are incorporated herein by reference, further comprising:

establishing response location correlation criteria, wherein said correlating is based upon said response location correlation criteria, and wherein said indicator comprises an indication of at least one of a failure, a change in performance, a change in temperature, and a lack of electrical activity from within said circuitry.

13. The method according to claim 11, all the limitations of which are incorporated herein by reference, further comprising:

establishing circuit connectivity tracing criteria; and based upon said circuit connectivity tracing criteria, correlating said first location with said specific second location at said time said indicator was sensed to trace and determine connectivity of said circuitry, wherein said indicator comprises an indication of at least one of electrical activity and a lack of electrical activity.

14. The method according to claim 11, all the limitations of which are incorporated herein by reference, wherein said inputting further comprises generating test pattern signals selected to activate said response within said circuitry and repeatedly inputting said test pattern signals into said input pins of said device.

15. The method according to claim 11, all the limitations of which are incorporated herein by reference, wherein said applying of said stimulating energy source comprises at least one of applying said energy source at a fixed location on said device, applying said energy source to multiple first locations by stepping to different regions on said device, applying said energy source to multiple first locations by raster scanning, applying said energy source to multiple first locations by grid scanning, and applying said energy source to multiple first locations by full field scanning.

16. The method according to claim 1, all the limitations of which are incorporated herein by reference, wherein said circuitry comprises multiple regions of circuitry, wherein each of said multiple regions of circuitry comprises at least one circuit element, and wherein said location within said circuitry responsible for said response comprises at least one of said regions of circuitry.

17. The method according to claim 6, all the limitations of which are incorporated herein by reference, wherein said circuitry comprises multiple regions of circuitry, wherein each of said multiple regions of circuitry comprises at least one circuit element and wherein said location within said circuitry responsible for said response comprises at least one of said regions of circuitry.

18. The method according to claim 11, all the limitations of which are incorporated herein by reference,
  wherein said circuitry comprises multiple regions of circuitry,
  wherein each of said multiple regions of circuitry comprises at least one circuit element and
  wherein said location within said circuitry responsible for said response comprises at least one of said regions of circuitry.

19. The method according to claim 1, all the limitations of which are incorporated herein by reference said applying of said stimulating energy source comprises applying one of a an electron beam, a magnetic field, an electric field, an acoustic source, an ion beam, and a particle source.

20. The method according to claim 6, all the limitations of which are incorporated herein by reference said applying of said stimulating energy source comprises applying one of a an electron beam, a magnetic field, an electric field, an acoustic source, an ion beam, and a particle source.

* * * * *